(12) United States Patent
Park (10) Patent No.: US 10,347,339 B2
(45) Date of Patent: Jul. 9, 2019

(54) SEMICONDUCTOR MEMORY DEVICE AND OPERATING METHOD THEREOF

(71) Applicant: SK hynix Inc., Gyeonggi-do (KR)

(72) Inventor: Eun Young Park, Chungcheongbuk-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/623,466

(22) Filed: Jun. 15, 2017

(65) Prior Publication Data

US 2018/0151230 A1     May 31, 2018

(30) Foreign Application Priority Data

Nov. 28, 2016    (KR) ........................ 10-2016-0158939

(51) Int. Cl.
| | | |
|---|---|---|
| *G11C 16/10* | (2006.01) | |
| *G11C 16/14* | (2006.01) | |
| *G11C 16/04* | (2006.01) | |
| *G11C 16/26* | (2006.01) | |
| *G11C 16/08* | (2006.01) | |
| *G11C 16/16* | (2006.01) | |
| *G11C 16/24* | (2006.01) | |
| *G11C 16/32* | (2006.01) | |

(52) U.S. Cl.
CPC .......... *G11C 16/14* (2013.01); *G11C 16/0483* (2013.01); *G11C 16/08* (2013.01); *G11C 16/10* (2013.01); *G11C 16/16* (2013.01); *G11C 16/24* (2013.01); *G11C 16/26* (2013.01); *G11C 16/32* (2013.01)

(58) Field of Classification Search
CPC ...... G11C 16/16; G11C 16/14; G11C 16/3445
USPC ....................................... 365/185.29, 185.26
See application file for complete search history.

(56) References Cited

U.S. PATENT DOCUMENTS

2015/0155047 A1*   6/2015   Kim .................... G11C 16/107
                                              365/185.29

FOREIGN PATENT DOCUMENTS

| KR | 1020140028732 | 3/2014 |
|---|---|---|
| KR | 1020140135402 | 11/2014 |
| KR | 1020160059745 | 5/2016 |

* cited by examiner

*Primary Examiner* — Jason Lappas
(74) *Attorney, Agent, or Firm* — IP & T Group LLP (57) ABSTRACT

A semiconductor memory device includes a memory cell array including a plurality of memory blocks, a voltage generator suitable for applying an erase voltage to a source line of at least one memory block selected from among the plurality of memory blocks during an erase operation, a read and write circuit suitable for applying an initial setting voltage, to bit lines of at least one memory block during the erase operation, and a control logic suitable for controlling the voltage generator and the read and write circuit to apply the initial setting voltage to the bit lines before applying the erase voltage to the source line.

14 Claims, 8 Drawing Sheets

SEMICONDUCTOR MEMORY DEVICE AND OPERATING METHOD THEREOF

CROSS-REFERENCE TO RELATED APPLICATION

The present application claims priority under 35 U.S.C. § 119(a) to Korean patent application number 10-2016-0158939, filed on Nov. 28, 2016, the entire disclosure of which is incorporated herein by reference in its entirety.

BACKGROUND

Field of Invention

Various embodiments of the invention relate generally to an electronic device, and more particularly, to a semiconductor memory device and an operating method thereof.

Description of Related Art

Semiconductor memory devices are generally classified into volatile and nonvolatile memory devices.

Unlike a volatile memory device, a nonvolatile memory device can, maintain data stored therein even when a power supply to the device is interrupted. However, read and write speeds of a nonvolatile memory device are comparatively lower than those of a volatile memory device. Therefore, nonvolatile memory devices may be employed in applications requiring maintaining the stored data regardless of whether or not the power supply is on or off. Examples of a nonvolatile memory device include a read-only memory (ROM), a mask ROM (MROM) a programmable ROM (PROM), an erasable programmable ROM (EPROM), an electrically erasable programmable ROM (EEPROM), a flash memory, a phase-change random access memory (PRAM), a magnetic RAM (MRAM), a resistive RAM (RRAM), and a ferroelectric RAM (FRAM). The flash memory may be classified into NOR and a NAND flash memory.

Flash memory combines both the advantages of a RAM in that data is programmable and erasable, and the advantages of a ROM in that data stored therein may be retained even when power is interrupted. Flash memory is widely used as a storage medium for portable electronic devices such as a digital camera, a personal digital assistant (PDA) and MP3.

Flash memory devices may be classified into a two dimensional semiconductor device in which strings are horizontally formed on a semiconductor substrate, and a three-dimensional semiconductor device in which strings are vertically formed on the semiconductor substrate.

The three-dimensional semiconductor device was devised to overcome a limitation in the degree of integration of the two-dimensional semiconductor device and includes a plurality of strings which are vertically formed on a semiconductor substrate. Each string includes a drain select transistor, memory cells and a source select transistor which are coupled in series between a bit line and a source line.

SUMMARY

Various embodiments are directed to a semiconductor memory device capable of improving erase efficiency of the semiconductor memory device and an operating method thereof.

According to an embodiment, a semiconductor memory device may include a memory cell array including a plurality of memory blocks, a voltage generator suitable for applying an erase voltage to a source line of at least one memory block selected from among the plurality of memory blocks during an erase operation, a read and write circuit suitable for applying an initial setting voltage to bit lines of at least one memory block during the erase operation, and a control logic suitable for controlling the voltage generator and the read and write circuit to apply the initial setting voltage to the bit lines before applying the erase voltage to the source line.

A semiconductor memory device may include memory string including a source selection transistor, a plurality of memory cells, and a drain selection transistor coupled in series between a source line and a bit line, a page buffer coupled to the bit line, and a voltage generator suitable for applying a pre-erase voltage and an erase voltage to the source line, wherein during an erase operation, the page buffer circuit applies an initial setting voltage to the bit line before the pre-erase voltage is applied to the source line, and floats the bit line when the pre-erase voltage and the erase voltage are applied to the source line A method of operating a semiconductor device, the method may include applying an initial setting voltage to bit lines of a selected memory block, among a plurality of memory blocks, floating the bit lines, and applying an erase voltage to a source line of the selected memory block when the bit lines are floated.

A semiconductor memory device may include a memory cell array including a plurality of memory blocks, a voltage generator suitable for applying an erase voltage to a source line of at least one memory block selected from among the plurality of memory blocks during an erase operation, a read and write circuit suitable for applying the erase voltage to bit lines of the at least one memory block during the erase operation, and a control logic suitable for controlling the voltage generator and the read and write circuit to simultaneously or alternately apply the erase voltage to the source line and the bit lines during the erase operation.

BRIEF DESCRIPTION OF THE DRAWINGS

The above and other features and advantages of the present invention will become more apparent to those skilled in the art to which the present invention belongs by describing in detail various embodiments thereof with reference to the attached drawings in which.

DETAILED DESCRIPTION

Hereinafter, embodiments of the present invention will be described in greater detail with reference to the accompanying drawings. However, we note that the present invention may be embodied in different forms and should not be construed as being limited to the embodiments set forth herein. Rather these embodiments are provided so that this disclosure will be thorough and complete, and will fully convey the scope of the described embodiments to those skilled in the art to which the present invention pertains.

In the drawings, dimensions may be exaggerated for clarity of illustration. It will be understood that when an element is referred to as being "between" two elements, it can be the only element between the two elements, or one or more intervening elements may also be present. Like reference numerals refer to like elements throughout.

Also, the drawings are simplified schematic illustrations of the various embodiments and their various features. As such, well-known features and details may be omitted. Furthermore variations from the size and shape of the various illustrated features are to be expected. For example, the size and/or shape of illustrated features may change as a result of manufacturing techniques and/or tolerances. The described embodiments should not be construed as being limited to the particular shapes and/or size of features illustrated herein but may include deviations in shapes that result, for example, from manufacturing. In the drawings, lengths and sizes of layers and regions may be exaggerated for clarity. Like reference numerals in the drawings denote like elements.

Terms such as 'first' and 'second' may be used to describe various components, but they should not limit the various components. Those terms are only used for the purpose of differentiating a component from other components. For example, a first component may be referred to as a second component, and a second component may be referred to as a first component and so forth without departing from the spirit and scope of the present disclosure. Furthermore, 'and/or' may include any one of or a combination of the components mentioned.

Furthermore, a singular form may include a plural from as long as it is not specifically mentioned in a sentence. Furthermore, "include/comprise" or "including/comprising" used in the specification represents that one or more components, steps, operations, and elements exist or are added.

Furthermore, unless defined otherwise, all the terms used in this specification including technical and scientific terms have the same meanings as would be generally understood by those skilled in the related art in view of the present disclosure. The terms defined in generally used dictionaries should be construed as having the same meanings as would be construed in the context of the present disclosure and the related art, and unless clearly defined otherwise in this specification should not be construed as having idealistic or overly formal meanings.

It is also noted that in this specification, "connected/coupled" refers to one component not only directly coupling another component but also indirectly coupling another component through an intermediate component. On the other hand, "directly connected/directly coupled" refers to one component directly coupling another component without an intermediate component.

In the following description, numerous specific details are set forth in order to provide a thorough understanding of the present invention. The present invention may be practiced without some or all of these specific details In other instances, well-known process structures and/or processes have not been described in detail in order not to unnecessarily obscure the present invention.

It is also noted, that in some instances as would be apparent to those skilled in the relevant art, an element also referred to as a feature, described in connection with one embodiment may be used singly or in combination with other elements of another embodiment, unless specifically indicated otherwise.

Hereinafter, the various embodiments of the present invention will be described in detail with reference to the attached drawings.

Figure 1:
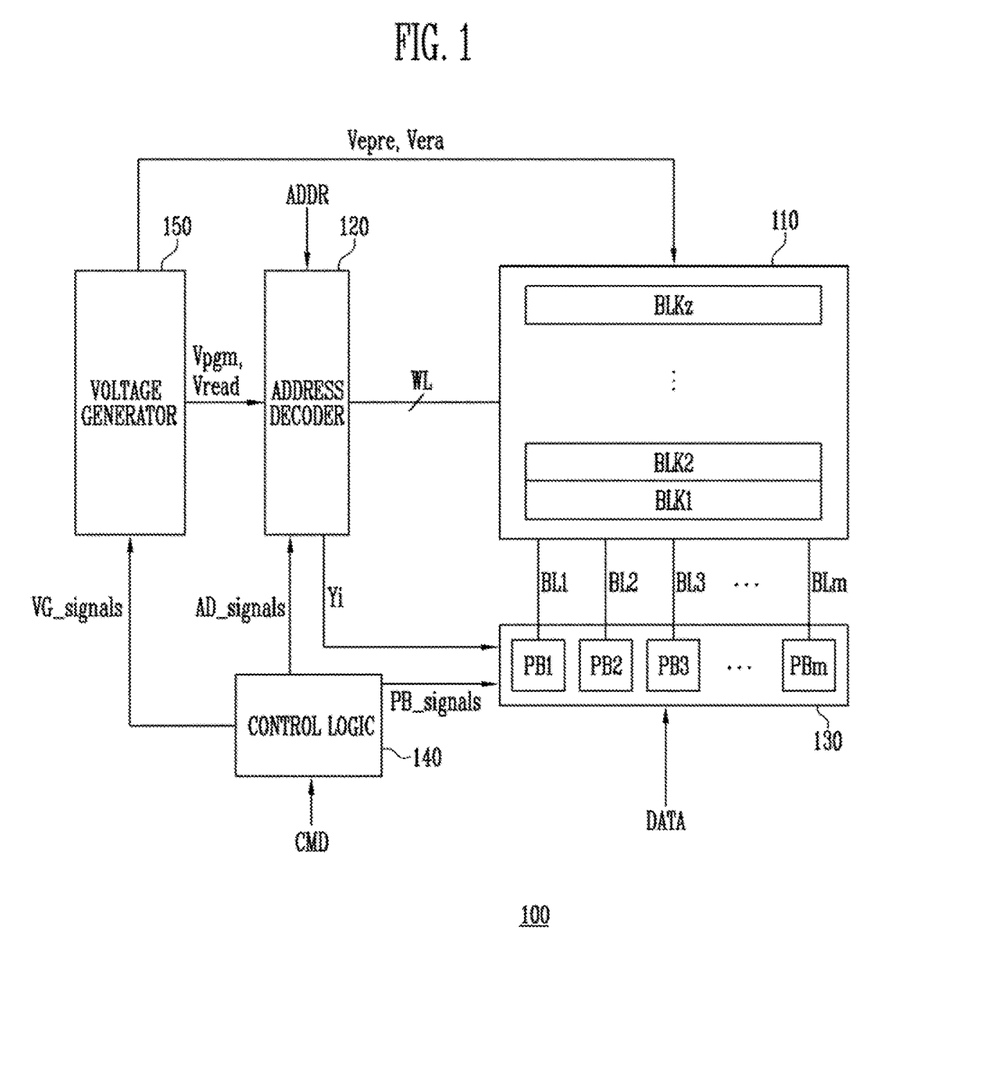
FIG. 1 is a block diagram illustrating a semiconductor memory device according to an embodiment.

FIG. 1 is a block diagram illustrating a semiconductor memory device 100 according to an embodiment.

Referring to FIG. 1 the semiconductor memory device 100 may include a memory cell array 110, an address decoder 120, a read and write circuit 130, a control logic 140, and a voltage generator 150.

The address decoder 120, the read and write circuit 130 and the voltage generator 150 may be defined as peripheral circuits configured to perform an erase operation on the memory cell array 110.

The memory cell array 110 may include a plurality of memory blocks BLK1 to BLKz. The memory blocks BLK1 to BLKz may be coupled to the address decoder 120 through word lines WL. The memory blocks BLK1 to BLKz may be coupled to the read and write circuit 130 through bit lines BL1 to BLm. Each of the memory blocks BLK1 to BLKz may include a plurality of memory cells. According to an embodiment, plurality of memory cells may be non-volatile memory cells. More specifically, the plurality of memory cells may be non-volatile memory cells based on a charge trap device. A plurality of memory cells coupled in common to the same word line may be defined as one page. The memory cell array 110 may include a plurality of pages. In addition, each of the memory blocks BLK1 to BLKz of the memory cell array 110 may include a plurality of strings. Each of the plurality of strings may include a drain selection transistor, a plurality of memory cells and a source selection transistor coupled in series between a bit line and a source line.

The address decoder 120 may be coupled to the memory cell array 110 through word lines WL. The address decoder 120 may be configured to operate in response to control signals AD_signals output from the control logic 140. The address decoder 120 may receive an address ADDR through an input/output buffer (not illustrated) in the semiconductor memory device 100.

The address decoder 120 may apply program voltage Vpgm or a read voltage Vread generated by the voltage generator 150 to the word lines WL of the memory cell array 110 during a program operation or a read operation. In addition, the address decoder 120 may control the word lines WL of the memory ell array 110 to be in a floating state during an erase operation.

An erase operation of the semiconductor memory device 100 may be performed in units of memory blocks. When an erase command is input with respect to the entirety of the memory blocks, the memory blocks BLK1 to BLKz may be simultaneously or sequentially erased. In addition, as for a program or read operation of the semiconductor memory device 100, at least one of the memory blocks BLK1 to BLKz may be selected and a program operation may be performed on the selected memory block. A program or read operation of the selected memory block may be performed in units of pages.

The address ADDR received at the request for the erase operation of the semiconductor memory device may include a block address. The address decoder 120 may select at least one memory block or the entirety of blocks in response to the block address.

In addition, the address ADDR received during general operations of the semiconductor memory device may include a block address, a row address and a column address. The address decoder 120 may select one memory block and one word line according to the block address and the row address. A column address Yi may be decoded by the address decoder 120 and provided to the read and write circuit 130.

The address decoder 120 may include block decoder, a row decoder, a column decoder and an address buffer.

The read and write circuit 130 may include a plurality of page buffers PB1 to PBm. The page buffers PB1 to PBm may be coupled to the memory cell array 110 through the bit lines BL1 to BLm. Each of the page buffers PB1 to PBm may apply an initial setting voltage to each of the bit lines BL1 to BLm during an erase operation before a pre-erase voltage Vepre is applied to a source line of the selected memory block. The initial setting voltage may be greater than 0V and lower than a power voltage Vcc.

In addition, each of the page buffers PB1 to PBm may temporarily store data DATA input during a program operation and control a potential level of each of the bit lines BL1 to BLm corresponding thereto in response to the temporarily stored data DATA. In addition, the read and write circuit 130 may sense the potential level or the amount of current in each of the bit lines BL1 to BLm, temporarily store read data and output the read data to the outside during a read operation, The read and write circuit 130 may operate in response to control signals PB_signals output from the control logic 140.

The control logic 140 may be coupled to the address decoder 120, the read and write circuit 130, and the voltage generator 150. The control logic 140 may receive a command CMD through an input/output buffer (not illustrated) of the semiconductor memory device 100. The control logic 140 may be configured to control the general operations of the semiconductor memory device 100 in response to the command CMD.

When the command CMD corresponding to an erase operation is input, the control logic 140 may control the read and write circuit 130 to apply an initial setting voltage to the bit lines BL1 to BLm. Subsequently, the control logic 140 may control the voltage generator 150 to sequentially apply the pre-erase voltage Vepre and an erase voltage Vera to the source line of the selected memory block while the bit lines BL1 to BLm are floated.

In addition, according to another embodiment, the control logic 140 may control the read and write circuit 130 to apply the pre-erase voltage Vepre and the erase voltage Vera, which are applied to the source line, to the bit lines BL1 to BLm during the erase operation. The pre-erase voltage Vepre and the erase voltage Vera may be simultaneously or alternately applied to the source line and the bit lines BL1 to BLm. In addition, the pre-erase voltage Vepre and the erase voltage Vera may be applied to the bit lines BL1 to BLm for a shorter period of time than to the source line.

The voltage generator 150 may operate in response to control signals VG_signals output from the control logic 140.

The voltage generator 150 may sequentially generate the pre-erase voltage Vepre and the erase voltage Vera and provide the generated voltages to selected memory blocks, among the memory blocks BLK1 to BLKz, through the source line of the memory cell array 110, during the erase operation in response to the control logic 140.

In addition, the voltage generator 150 may generate the program voltage Vpgm or the read voltage Vread during a program operation or a read operation in response to control of the control logic 140.

Figure 2:
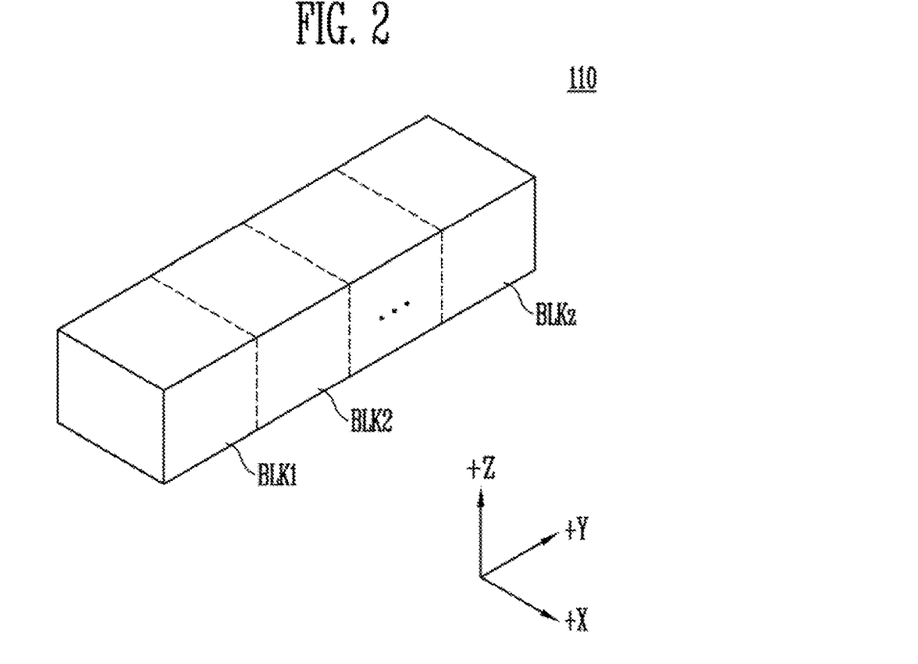
FIG. 2 is a block diagram illustrating a memory cell array shown in FIG. 1.

FIG. 2 is a block diagram illustrating an embodiment of the memory cell array 110 shown in FIG. 1.

Referring to FIG. 2, the memory cell array 110 may include the plurality of memory blocks BLK1 to BLKz having a three-dimensional structure. Each of the memory blocks BLK1 to BLKz may include a plurality of memory cells stacked on the substrate. The plurality of memory cells may be arranged in +X direction, +Y direction and +Z direction. Each of the memory blocks may be described in more detail with reference to FIGS. 3 and 4.

Figure 3:
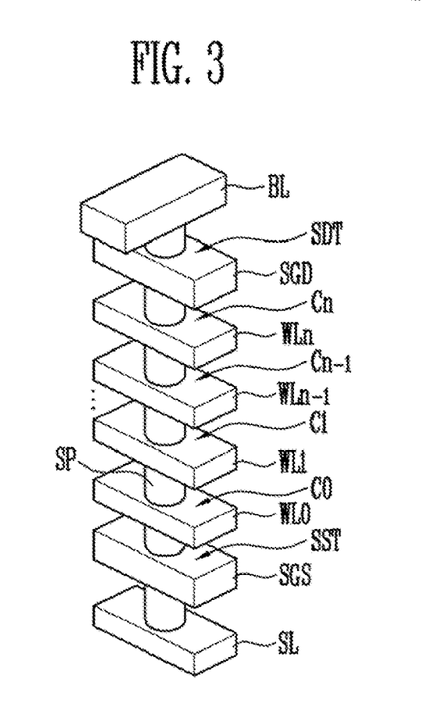
FIG. 3 is a three-dimensional diagram illustrating a memory string included in a memory block according to an embodiment.
Figure 4:
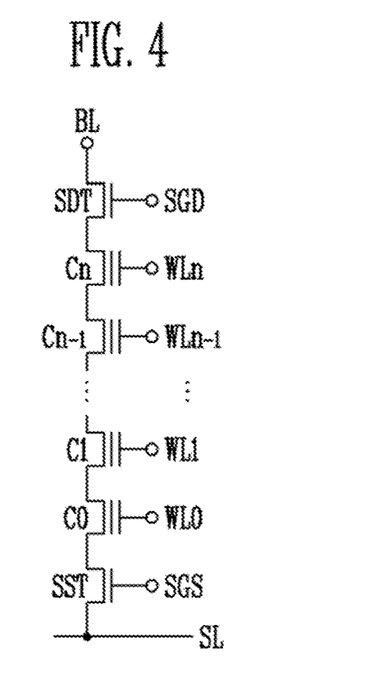
FIG. 4 is a circuit diagram illustrating a memory string shown in FIG. 3.

FIG. 3 is a three-dimensional view illustrating a memory string included in a memory block according to an embodiment. FIG. 4 is a circuit diagram illustrating a memory string.

Referring to FIGS. 3 and 4, a source line SL may be formed on the semiconductor substrate. A vertical channel layer SP may be formed on the source line SL. A top portion of the vertical channel layer SP may be coupled to a bit line BL. The vertical channel layer SP may include polysilicon. A plurality of conductive layers SGS, WL0 to WLn, and SGD may be formed to surround the vertical channel layer SP at different heights. A multilayer film (not illustrated) including a charge storage layer may be formed on the surface of the vertical channel layer SP. The multilayer film may also be positioned between the vertical channel layer SP and the conductive layers SGS, WL0 to WLn, and SGD. The multilayer film may include an ONO structure in which an oxide layer, a nitride layer, and an oxide layer are sequentially stacked on each other. The conductive layers WL0 to WLn may be word lines, the conductive layer SGS may be defined as a source selection line coupled to a source selection transistor SST, and the conductive layer SGD may be defined as a drain selection line coupled to a drain selection transistor SDT.

The lowermost conductive layer may be a source selection line or first selection line SGS, and the uppermost conductive layer may be a drain selection line or second selection line SGD. The conductive layers between the source and drain selection lines SGS and SGD may be word lines WL0 to WLn. That is, the conductive layers SGS, WL0 to WLn, and SGD may be stacked to form a multilayered structure on the semiconductor substrate, and the vertical channel layer SP passing through the conductive layers SGS, WL0 to WLn, and SGD may be coupled in a vertical direction between the bit line BL and the source line SL formed on the semiconductor substrate.

The drain selection transistor SDT may be formed at a position where the uppermost conductive layer SGD surrounds the vertical channel layer SP, and the source selection transistor SST may be formed at a position where the lowermost conductive layer SGS surrounds the vertical channel layer SP. Memory cells C0 to Cn may be formed at positions where intermediate conductive layers WL0 to WLn surround the vertical channel layer SP, respectively The memory string having the above-described structure may include the source selection transistor SST, the memory cells C0 to Cn and the drain selection transistor SDT coupled in a vertical direction to the substrate between the source line SL and the bit line BL. The source selection transistor SST may electrically connect the memory cells C0 to Cn to the source line SL in response to a first selection signal applied to the first selection line SGS. The drain selection transistor SDT may electrically couple the memory cells C0 to Cn to the bit line BL in response to a second selection signal applied to the second selection line SGD.

Figure 5:
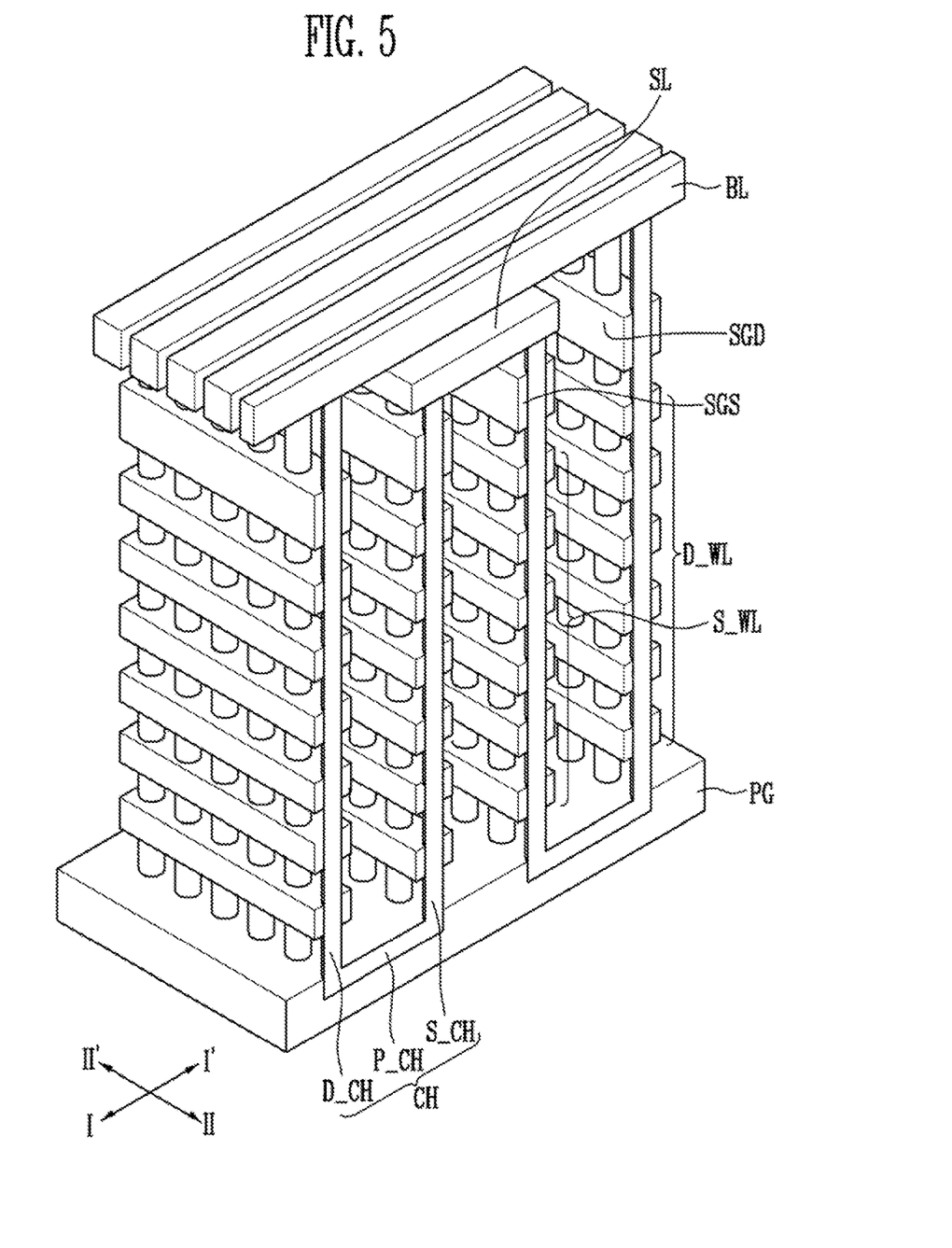
FIG. 5 is a perspective view illustrating a memory string included in a memory block according to another embodiment.

FIG. 5 is a perspective view for illustrating a memory string included in a memory block according to another embodiment. For convenience of description, interlayer insulating layers are not illustrated.

As shown in FIG. 5, a memory block may include U-shaped channel layers CH arranged in a first direction I-I' and a second direction II-II' crossing the first direction I-I'. In addition, the U-shaped channel layer CH may include a pipe channel layer P_CH formed in a pipe gate PG and a pair of a source side channel layer S_CH and a drain side channel layer D_CH coupled to the pipe channel layer P_CH.

In addition, the semiconductor memory device may include a plurality of conductive layers S_WL stacked on the pipe gate PG along the source side channel layer S_CH and a plurality of conductive layers D_WL stacked on the pipe gate PG along the drain side channel layer D_CH. The conductive layer SGS configured as a source selection transistor y be formed over the plurality of conductive layers S_WL, and the conductive layer SGD configured as a drain selection transistor may be formed over the plurality of conductive layers D_WL.

Accordingly, memory cells may be stacked along the U-shaped channel layer CH. A drain selection transistor and a source selection transistor may be provided at both ends of the U-shaped channel layer CH. The pipe gate PG located at the bottom of the U-shaped string may be located at the center of the memory cells and operate as a pipe transistor.

In addition, the semiconductor memory device may include the bit line BL, coupled to the drain side channel layer D_CH and extending in the first direction I-I' and the source line SL coupled to the source side channel layer S_CH and extending in the second direction II-II'.

Figure 6:
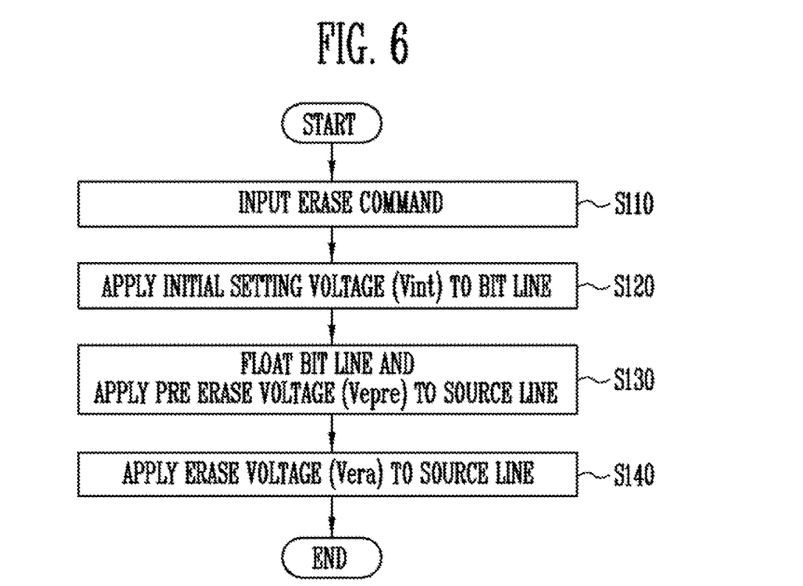
FIG. 6 is a flowchart illustrating operations of a semiconductor memory device according to an embodiment.

FIG. 6 is a flowchart illustrating operations of a semiconductor memory device according to an embodiment.

Figure 7:
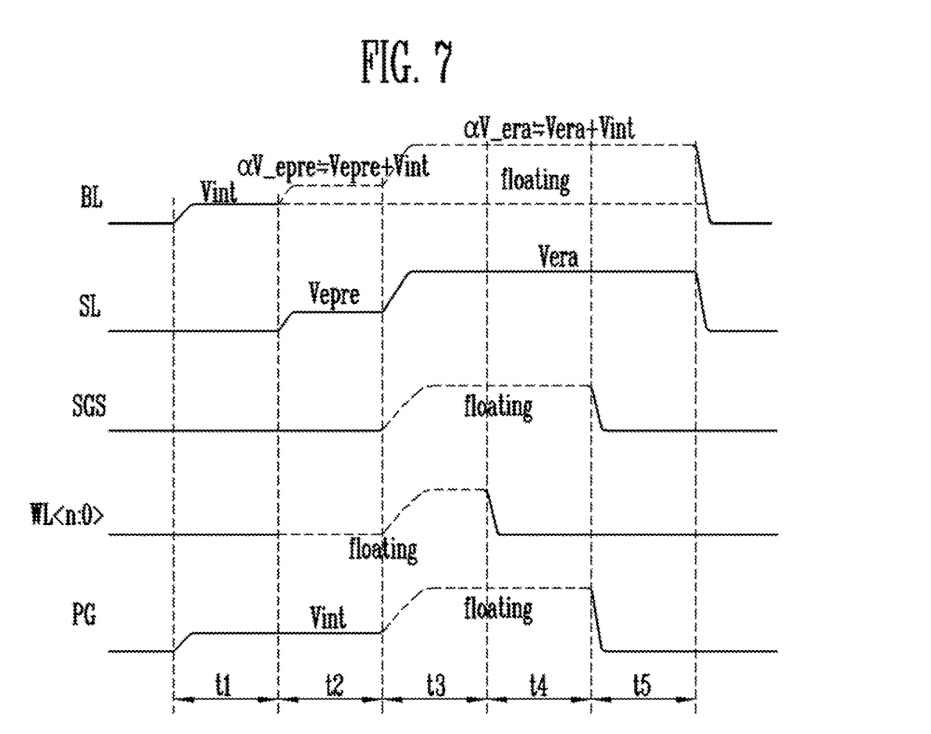
FIG. 7 is a waveform view illustrating signals for illustrating operations of a semiconductor memory device according to an embodiment.

FIG. 7 is a waveform view of signals for illustrating operations of a semiconductor memory device according to an embodiment.

An erase operation semiconductor memory device according to an embodiment is described below with reference to FIGS. 1 to 7.

At step S110, when the command CMD is externally input with reference to an erase command, the control logic 140 may control peripheral circuits to perform an erase operation on the semiconductor memory device.

At step S120, the plurality of page buffers PB1 to PBm included in the read and write circuit 130 may apply an initial setting voltage Vint to the bit lines BL1 to BLm during a period t1 in response to the control signals PB_signals output from the control logic 140. The initial setting voltage may be greater than 0V and lower than the power voltage Vcc. A ground voltage Vss of 0V may be applied to word lines WL<n:0>.

At step S130, after the period t1 ends, the page buffers PBI to PBm may block the supply of the initial setting voltage Vint so that the bit lines BL1 to BLm may be controlled to be in a floating state during a period t2. At the same time, the voltage generator 150 may apply the pre-erase voltage Vepre to the source line SL of a selected memory block. As a result, potential levels of the bit lines BL1 to BLm in the floating state may increase to a predetermined potential level α V_epre by a coupling phenomenon caused by the pre-erase voltage Vepre applied to the source line SL. The predetermined potential level α V_epre may approximate to the sum of the pre-erase voltage Vepre and the initial setting voltage Vint. That is the potential levels of the bit lines B L1 to BLm may be increased from the initial setting voltage Vint by the pre-erase voltage Vepre.

During the period t2, a gate induced drain leakage (GIDL) current may be formed in a channel under the source selection transistor SST by the pre-erase voltage Vepre applied to the source line SL, and may flow in a channel direction. Furthermore, hot holes may be generated in a drain region of the source selection transistor SST and introduced in the channel direction, so that a potential level of the channel may be increased. The word lines WL<n:0> may be controlled to be in a floating state.

At step S140, the voltage generator 150 may generate the erase voltage Vera greater than the pre-erase voltage Vepre and apply the erase voltage Vera to the source line SL of the selected memory block from a period t3. As a result, the potential level of the channel may be further increased.

The potential level α V_pre of the bit lines BL1 to BLm may increase to a potential level approximating the sum of the erase voltage Vera and the initial setting voltage Vint applied to the source line SL.

During the period t3, the source selection line SGS coupled to a gate of the source selection transistor SST may be controlled to be in a floating state.

Subsequently, the word lines WL<n:0> of the floating state may be controlled to change to have a ground voltage level during a period t4. As a result, electrons stored in the charge storage layers of the memory cells C0 to Cn may be trapped by the channel having the high potential level and the word lines WL<n:0> having the ground voltage level. That is, the data stored in the memory cells C0 to Cn may be erased.

Subsequently, during a period t5, the source selection line SGS of the floating state may be controlled to change to have a ground voltage level which thereby turns off the source selection transistor SST, so that the erase operation may be terminated.

As described above, since the initial setting voltage Vint is applied to the bit lines BL1 to BLm by using the page buffers PB1 to PBm during the period t1 before the pre-erase voltage Vepre and the erase voltage Vera are applied, the potential levels of the bit lines BL1 to BLm may be increased by the initial setting voltage Vint through a coupling phenomenon during the operation of applying the pre-erase voltage Vepre and the erase voltage Vera. Therefore, the difference in potential level between the bit lines BL1 to BLm and the source line SL may be reduced to improve the erase operation. In addition, since the potential levels of the bit lines BL1 to BLm are increased, hot holes may be formed in the channel under the drain select on transistor SDT to improve the efficiency of the erase operation.

The above-described erase operation is described based on the memory string shown in FIG. 3 and 4 as an example. However, when the memory string includes the pipe transistor as shown in FIG. 5, the initial setting voltage Vint may be applied to the pipe gate PG during the periods t1 and t2 and the pipe gate PG may be controlled to be in a floating state during the period t3 as shown in FIG. 7. The initial setting voltage Vint applied to the pipe gate PG may be a positive voltage different from the initial setting voltage Vint applied to the bit lines BL1 to BLm.

Therefore, it may be easier to transfer a bias through the pipe transistor, so that the potential level of the channel may be uniformly increased.

In addition, in the above-described embodiment, a ground voltage is described and illustrated as being applied to the word lines WL<n:0> during the periods t1 and t2. However a positive set voltage may be applied to the word lines WL<n:0> during the periods t1 and t2. Therefore, when the pipe gate PG is in a floating state during the period t3, the potential levels of the word lines WL<n:0> may be further increased, so that it may be easier to transfer a bias through the channel.

In addition, the positive set voltage may also be applied to the source line SL during the period t1 before the pre-erase voltage Vepre is applied, and the source line S L may decrease to a ground voltage level, so that initial potential levels of the bit lines BL1 to BLm may be further increased by a coupling phenomenon.

Figure 8:
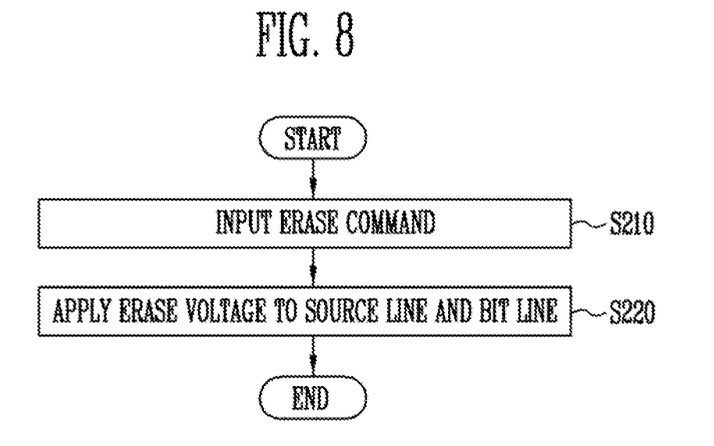
FIG. 8 is a flowchart illustrating operations of a semiconductor memory device according to another embodiment.

FIG. 8 is a flowchart illustrating operations of a semiconductor memory device according to another embodiment.

Figure 9:
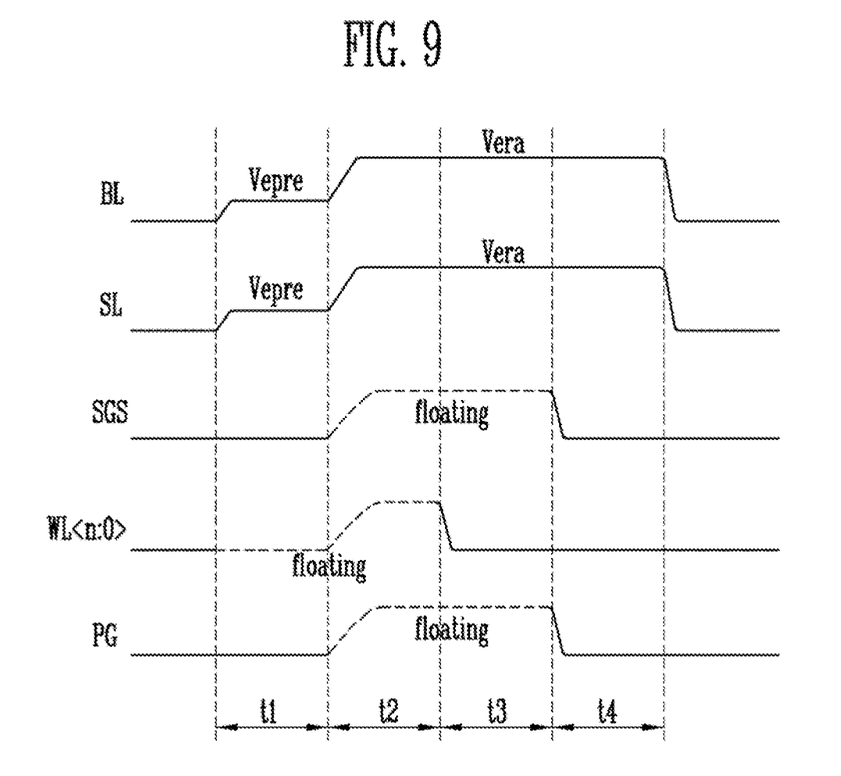
FIG. 9 is a waveform view of signals for illustrating operations of a semiconductor memory device according to another embodiment.

FIG. 9 is a waveform view of signals for illustrating operations of a semiconductor memory device according to another embodiment.

An erase operation of a semiconductor memory device according to an embodiment is described with reference to FIGS. 1 to 5, 8 and 9.

At step S210, when the command CMD is externally input with respect to an erase command, the control logic 140 may control peripheral circuits to perform an erase operation on the semiconductor memory device.

At step S220, the voltage generator 150 and the read and write circuit 130 may apply the pre-erase voltage Vepre and the erase voltage Vera to the source line SL and the bit lines BL1 to BLm to perform the erase operation.

This will be described below in more detail.

During the period t1, the voltage generator 150 may apply the pre-erase voltage Vepre to the source line SL of the selected memory block, and the page buffers PB1 to PBm included in the read and write circuit 130 may apply the same voltage as the pre-erase voltage Vepre applied to the source line SL to the bit lines BL1 to BLm in response to the control signals PB_signals output from the control logic 140. The word lines WL<n:0> may be controlled to be in a floating state.

A gate induced drain leakage (GIDL) current may be formed in a channel under the source selection transistor SST by the pre-erase voltage Vepre applied to the source line SL. A gate induced drain leakage (GIDL) current may also be formed in a channel under the drain selection transistor SDT by the pre-erase voltage Vepre applied to the bit lines BL1 to BLm.

After the period t1 ends, the voltage generator 150 and the page buffers PB1 to PBm may apply the erase voltage Vera to the source line SL and the bit lines BL1 to BLm in response to the control signals VG_signals and PB_signals output from the control logic 140 during the period t2. Therefore, the potential level of the channel may be further increased. During the period t2, the source selection line SGS coupled to the gate of the source selection transistor SST may be controlled to be in a floating state.

Subsequently, during the period t3 the word lines WL<n:0> of the floating state may be controlled to change to the ground voltage levels. Thus, electrons stored in charge storage layers of the memory cells C0 to Cn may be trapped by the channel having the high potential level and the word lines WL<n:0> having the ground voltage level. That is, data stored in the memory cells C0 to Cn may be erased.

Subsequently, during the period t4, the source selection line SGS of the floating state may be controlled to change to a ground voltage level which thereby turns off the source selection transistor SST, so that the erase operation may be terminated.

As described above, since the pre-erase voltage Vepre and the erase voltage Vera are simultaneously applied to the source line SL and the bit lines BL1 to BLm, the difference in potential level between the bit lines BL1 to BLm and the source line SL may be reduced to thereby improve the erase operation. In addition, when the pre-erase voltage Vepre and the erase voltage Vera are applied to the bit lines BL1 to BLm, hot holes may also be formed in a channel under the drain selection transistor SDT, so that efficiency of the erase operation may be further increased.

The above-described erase operation is described based on the memory string shown in FIGS. 3 and 4 as an example. However, when a memory string includes a pipe transistor as shown in FIG. 5, a voltage applied to the pipe gate PG may be controlled to be in a floating state during the periods t2 and t3.

In the above-described embodiment, it is described that the pre-erase voltage Vepre and the erase voltage Vera are simultaneously applied to the source line SL and the bit lines BL1 to BLm. However, the pre-erase voltage Vepre and the erase voltage Vera may be alternately applied to the source line SL and the bit lines BL1 to BLm. In addition, since a capacitance value of the bit lines BL1 to BLm is lower than that of the source line SL, the pre-erase voltage Vepre and the erase voltage Vera may be applied to the bit lines BL1 to BLm for a shorter period of time, than to the source line SL.

Figure 10:
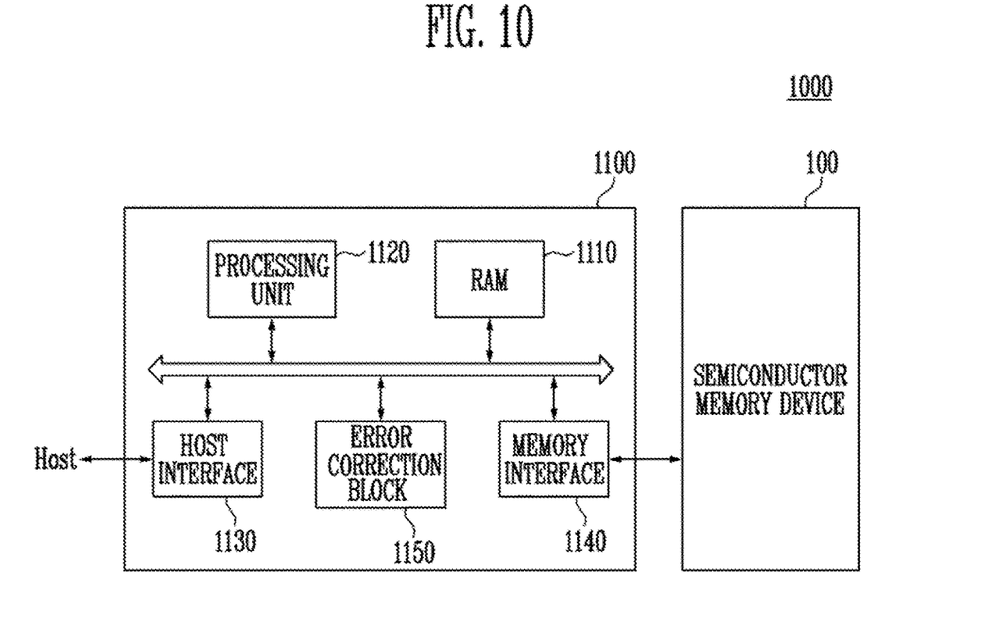
FIG. 10 is a memory system including a semiconductor memory device shown in FIG. 1.

FIG. 10 is a block diagram illustrating a memory system 1000 including the semiconductor memory device shown in FIG. 1.

Referring to FIG. 10, the memory system 1000 may include a semiconductor memory device 100 and a controller 1100.

The semiconductor memory device 100 may be configured and operated in substantially the same manner as described above with reference to FIG. 2. Thus, a detailed description thereof will be omitted.

The controller 1100 may be coupled to a host and the semiconductor memory device 100. The controller 1100 may access the semiconductor memory device 100 at the request of the host. For example, the controller 1100 may control a read operation, a program operation, an erase operation, and/or a background operation of the semiconductor memory device 100. The controller 1100 may provide an interface between the semiconductor memory device 100 and the host. The controller 1100 may drive firmware for controlling the semiconductor memory device 100.

The controller 1100 may include a random access memory (RAM) 1210, a processing unit 1120, a host interface 1130, a memory interface 1140 and an error correction block 1150. The RAM 1210 may be used as operation memory of the processing unit 1120, cache memory between the semiconductor memory device 100 and the host, and/or a buffer memory between the semiconductor memory device 100 and the host. The processing unit 1120 may control operations of the controller 1100. In addition, the controller 1100 may temporarily store program data provided from the host during a write operation.

The host interface 1130 may include a protocol for data exchange between the host and the controller 1100. According to an embodiment, the controller 1100 may communicate with the host using at least one of a variety of interface protocols, such as a universal serial bus (USB) protocol, a multimedia card (MMC) protocol, a peripheral component interconnection (PCI) protocol, a PCI-Express (PCI-E) protocol, an advanced technology attachment (ATA) protocol, a Serial-ATA protocol, a Parallel-ATA protocol, a small computer small interface (SCSI) protocol, an enhanced small disk interface (ESDI) protocol, an integrated drive electronics (IDE) protocol, and a private protocol.

The memory interface 1140 may interface with the semiconductor memory device 100. For example, the memory interface may include a NAND flash interface or a NOR flash interface.

The error correction block 1150 may detect and correct errors in data received from the semiconductor memory device 100 by using an error correction code (ECC). The processing unit 1120 may control the semiconductor memory device 100 to control a read voltage according to an error detection result and perform a re-read. According to an embodiment, the error correction block 1150 may be provided as a component of the controller 1100.

The controller 1100 and the semiconductor memory device 100 may be integrated in one semiconductor device. According to an embodiment, the controller 1100 and the semiconductor memory device 100 may be integrated in a single semiconductor device to form a memory card such as a PC card (personal computer memory card international association (PCMCIA)), a compact flash card (CF), a smart media card (SMC), a memory stick, a multimedia card (MMC, RS-MMC or MMCmicro), an SD card (SD, miniSD, micro SD or SDHC), a universal flash storage device (UFS), etc.

The controller 1100 and the semiconductor memory device 100 may be integrated in a single semiconductor device to form a solid state drive (SSD). The SSD may include a storage device for storing data in a semiconductor memory device. When the memory system 1000 is used as an SSD, operational rates of the host coupled to the memory system 1000 may be significantly improved.

In another example, the memory system 1000 may be used as one of several elements in various electronic devices such as a computer, an ultra mobile PC (UMPC), a workstation, a net-book, a personal digital assistant (PDA), a portable computer, a web table, a wireless phone, a mobile phone, a smart phone, an e-book, a portable multimedia player (PMP), portable game machine, a navigation device, a black box, a digital camera, a three-dimensional television, a digital audio recorder, a digital audio player, a digital picture recorder, a digital picture player, a digital video recorder, a digital video player, a device for transmitting/receiving information in wireless environments, devices for home networks, devices for computer networks, devices for telematics networks, an RFID device, other devices for computing systems, etc.

According to an exemplary embodiment, the semiconductor memory device 100 or the memory system 1000 may be packaged in various forms. For example, the semiconductor memory device 100 or the memory system 1000 may be packaged by various methods such as a package on package (PoP), a ball grid array (BGA), a chip scale package (CSP), a plastic leaded chip carrier (PLCC), a plastic dual in line package (PDIP), a die in waffle pack, a die in wafer form, a chip on board (COB), a ceramic dual inline package (CERDIP) a plastic metric quad f at package (MQFP), a thin quad flat package (TQFP), a small outline integrated circuit (SOIC), shrink small outline package (SSOP), a thin small outline package (TSOP), a system in package (SIP), a multi chip package (MCP), a wafer-level fabricated package (WFP), a wafer-level processed stack package (WSP), etc.

Figure 11:
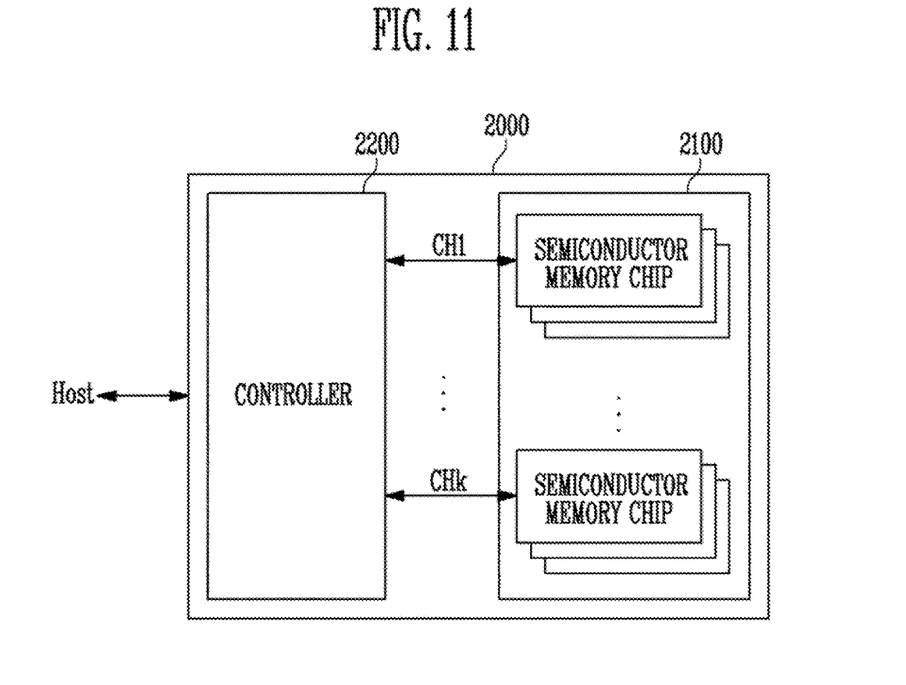
FIG. 11 is a block diagram illustrating an application example of a memory system shown in FIG. 7.

FIG. 11 is a block diagram illustrating an application example (2000) of the memory system 1000 shown in FIG. 10.

Referring to FIG. 11, a memory system 2000 may include a semiconductor memory device 2100 and a controller 2200. The semiconductor memory device 2100 may include semiconductor memory chips. The semiconductor memory chips may be divided into a plurality of groups.

FIG. 11 illustrates the plurality of groups communicating, with the controller 2200 through first to k-th channels CH1 to CHk. Each of the semiconductor memory chips may be configured and operated in substantially the same manner as the semiconductor memory device 100 described above with reference to FIG. 1.

Each group may communicate with the controller 2200 through a single common channel. The controller 2200 may be configured in substantially the same manner as the controller 1100 described with reference to FIG. 10, and configured to control the plurality of memory chips of the semiconductor memory device 2100.

Figure 12:
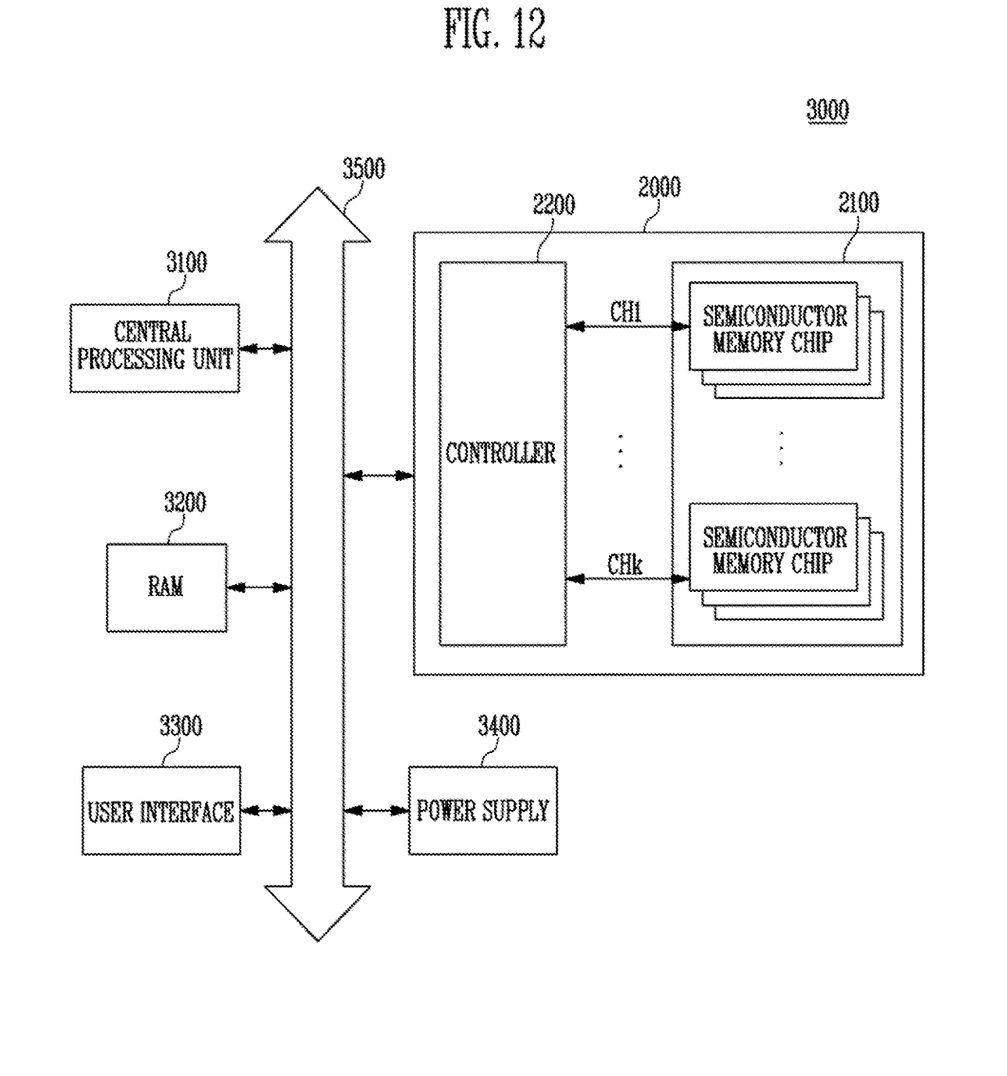
FIG. 12 is a block diagram illustrating a computing system including a memory system described with reference to FIG. 11.

FIG. 12 is a block diagram illustrating a computing system 3000 having the memory system 2000 described above with reference to FIG. 11.

Referring to FIG. 12, the computing system 3000 may include a central processing unit 3100, a random access memory (RAM) 3200, a user interface 3300, a power supply 3400, a system bus 3500, and a memory system 2000.

The memory system 2000 may be electrically connected to the central processing unit 3100, the RAM 3200, the user interface 3300 and the power supply 3400 through the system bus 3500. Data provided trough the user interface 3300 or processed by the central processing unit 3100 may be stored in the memory system 2000.

In FIG. 12, the semiconductor memory device 2100 may be coupled to the system bus 3500 through the controller 2200. However, the semiconductor memory device 2100 may be directly coupled to the system bus 3500. The central processing unit 3100 and the RAM 3200 may perform functions of the controller 2200.

As illustrated in FIG. 12, the memory system 2000 shown in FIG. 11 may be provided as the memory system 3000. However, the memory system 2000 may be replaced with the memory system 1000 shown in FIG. 10. According to an embodiment, the computing system 3000 may include both of the memory systems 1000 and 2000 described above with reference to FIGS. 10 and 11.

According to embodiments, during an erase operation of a semiconductor device, an initial voltage may be applied to a bit line before an erase voltage is applied to a source line, so that a potential level of the bit line may be increased to thereby improve erase efficiency.

It will be apparent to those skilled in the art that various modifications can be made to the above-described exemplary embodiments of the present invention without departing from the spirit or scope of the invention. Thus, it is intended that the present invention cover all such modifications provided they come within the scope of the appended claims and their equivalents.

What is claimed is:

1. A semiconductor memory device, comprising: a memory cell array including a plurality of memory blocks; a voltage generator that applies a pre-erase voltage and an erase voltage to a source line of at least one memory block selected from among the plurality of memory blocks during an erase operation; a read and write circuit that applies an initial setting voltage to bit lines of at least one memory block during the erase operation; and a control logic that controls the voltage generator and the read and write circuit to apply the initial setting voltage to the bit lines before applying the pre-erase voltage and the erase voltage to the source line, wherein the initial setting voltage is greater than 0V.

2. The semiconductor memory device of claim 1, wherein the initial setting voltage is lower than a power voltage.

3. The semiconductor memory device of claim 1, wherein the voltage generator applies the erase voltage by increasing the pre-erase voltage to the erase voltage.

4. The semiconductor memory device of claim 1, wherein the read and write circuit further controls the bit lines to be in a floating state when applying the erase voltage to the source line after applying the initial setting voltage to the bit lines.

5. The semiconductor memory device of claim 1, wherein the voltage generator further controls word lines of the at least one memory block to be in a floating state when applying the erase voltage.

6. The semiconductor memory device of claim 5, wherein the voltage generator further applies a positive set voltage to the word lines before controlling the word lines to be in the floating state.

7. The semiconductor memory device of claim 1, wherein the voltage generator further applies a positive set voltage to a gate of a pipe transistor included in the at least one memory block before applying the erase voltage to the source line, and further controls the pipe transistor to be in a floating state when applying the erase voltage to the source line.

8. The semiconductor memory device of claim 1, wherein the voltage generator further sequentially applies a predetermined positive voltage and a ground voltage to the source line before applying the erase voltage to the source line.

9. A method for operating a semiconductor device, the method comprising:
applying an initial setting voltage to bit lines of a selected memory block among a plurality of memory blocks, wherein the initial setting voltage is greater than 0V;
floating the bit lines after applying the initial setting voltage to the bit lines; and
applying a pre-erase voltage and an erase voltage to a source line of the selected memory block when the bit lines are floated.

10. The method of claim 9, wherein the initial setting voltage is lower than a power voltage.

11. The method of claim 9, wherein the applying of the pre-erase voltage and the erase voltage comprises:
applying the pre-erase voltage to the source line for a predetermined time when the bit lines are floated; and
increasing the pre-erase voltage to the erase voltage.

12. The method of claim 11,
wherein the applying of the initial setting voltage to the bit lines further comprises applying a positive set voltage to word lines of the selected memory block, and
wherein the increasing of the pre-erase voltage further comprises floating the word lines.

13. The method of claim 11, wherein the increasing of the pre-erase voltage further comprises floating a source selection line of the selected memory block.

14. The method of claim 11, further comprising sequentially applying a predetermined positive voltage and a ground voltage to the source line before applying the pre-erase voltage to the source line.

* * * * *